United States Patent
Wang et al.

(10) Patent No.: US 11,532,557 B2
(45) Date of Patent: Dec. 20, 2022

(54) PLANAR POWER MODULE WITH SPATIALLY INTERLEAVED STRUCTURE

(71) Applicant: XI'AN JIAOTONG UNIVERSITY, Xi'an (CN)

(72) Inventors: Laili Wang, Xi'an (CN); Fengtao Yang, Xi'an (CN); Wei Mu, Xi'an (CN); Dingkun Ma, Xi'an (CN); Cheng Zhao, Xi'an (CN); Jianpeng Wang, Xi'an (CN)

(73) Assignee: XI'AN JIAOTONG UNIVERSITY, Xi'an (CN)

( * ) Notice: Subject to any disclaimer, the term of this patent is extended or adjusted under 35 U.S.C. 154(b) by 0 days.

(21) Appl. No.: 17/134,908

(22) Filed: Dec. 28, 2020

(65) Prior Publication Data

US 2021/0202386 A1    Jul. 1, 2021

(30) Foreign Application Priority Data

Dec. 25, 2019 (CN) .......................... 201911360511.3

(51) Int. Cl.
*H01L 23/528* (2006.01)
*H01L 23/50* (2006.01)
*H01L 23/36* (2006.01)

(52) U.S. Cl.
CPC .......... *H01L 23/5286* (2013.01); *H01L 23/50* (2013.01); *H01L 23/36* (2013.01)

(58) Field of Classification Search
CPC ...... H01L 23/5286; H01L 23/50; H01L 23/36
See application file for complete search history.

(56) References Cited

U.S. PATENT DOCUMENTS

2017/0064808 A1*   3/2017   Rizza ...................... H01L 23/36

OTHER PUBLICATIONS

English Machine Translation of CN 102648519, Kitami et al., published Aug. 22, 2012.*
English Machine Translation of CN 108738369, Yuguchi et al., published Nov. 2, 2018.*

* cited by examiner

*Primary Examiner* — Peniel M Gumedzoe

(57) ABSTRACT

Provided is a planar power module with a spatially interleaved structure, including a top power substrate, a bottom power substrate arranged opposite to the top power substrate, and a plurality of interleaved switch units configured between the top power substrate and the bottom power substrate; wherein adjacent interleaved switch units are electrically connected through a current commutator so that the interleaved switch units form spatial position interleaving. Problems of uneven parallel currents and uneven heat dissipation in the power module are solved.

8 Claims, 3 Drawing Sheets

PLANAR POWER MODULE WITH SPATIALLY INTERLEAVED STRUCTURE

CROSS-REFERENCE TO RELATED APPLICATIONS

This application claims priority to Chinese Application No. 201911360511.3, filed on Dec. 25, 2019, entitled "Wide bandgap power module packaging structure suitable for a severe environment", which is hereby incorporated by reference.

TECHNICAL FIELD

The present invention relates to the field of semiconductor packaging technologies, and particularly to a planar power module with a spatially interleaved structure.

BACKGROUND

A power module is a type of module formed by packaging and integrating a plurality of electronic power chips according to designed functions. Before this, in a conventional solution, packaging integration is not performed, but to form a power electronic converter composed of separated electronic power chips. By contrast, the power module has lots of advantages, such as better electrical and thermal performance, better safety protection, lower manufacturing costs, or the like. With the development of electronic power chip technologies, the power module is developing towards miniaturization, high power density, high reliability, and low loss to meet market demands.

However, the existing packaging structure restricts the further improvement of the power semiconductor chips' performance. The use of emerging third-generation semiconductor power chips is limited for the following reasons:

1. A traditional multichip power module lacks current sharing capability among parallel chips. In high power applications, the power module needs to be integrated with several parallel chips to improve the current level. In actual usage, the electrical parasitic parameters of parallel chips' current-conducting branch structures are not balanced. Thus, it results in uneven distribution of parallel chips' current, which is likely to cause failure or damage to the entire power module.

2. Bonding wires is a general electrical connection in the traditional power module. It features that the heat dissipation is a single-sided pattern, which has low heat dissipation efficiency and large thermal resistance from chips to the environment. A few commercial power modules have adopted a double-sided heat dissipation structure, but these power modules are only packaged and integrated with a few chips, which cannot meet high-power or high-current application requirements.

3. The traditional power module cannot achieve even temperature distribution and balanced current sharing among the parallel chips. Thus, the most existing module cannot meet the requirements of high operating frequency, high power density, and extremely harsh environment. Even temperature distribution results in different failure rates of soldering layers, which could accelerate the module's failure module. A threshold voltage of the chip also is affected, which could aggravate the unbalanced current sharing among parallel chips. The unbalanced current sharing is mainly caused by the different parasitic inductance in parallel chips' conducting branches, which could result in uneven current and voltage stress in switching transience. In the worst situation, the chip could be destroyed.

In summary, due to the limitation of traditional packaging method, it is unable to make full use of electronic power semiconductors. Therefore, there is an urgent need for a new packaging structure to overcome the traditional power module's shortcomings. Thus, it can give full play to the excellent characteristics of the electronic power semiconductors.

In view of this, the present application is proposed.

SUMMARY OF THE INVENTION

The present invention discloses a planar power module with a spatially interleaved structure, which is intended to overcome the deficiency of the prior art.

An embodiment of the present invention provides a planar power module with a spatially interleaved structure, including a top power substrate, a bottom power substrate arranged opposite to the top power substrate, and a plurality of interleaved switch units configured between the top substrate and the bottom substrate;

wherein adjacent interleaved switch units are electrically connected through a current commutator so that the plurality of interleaved switch units form spatial position interleaving.

Preferably, the top power substrate includes a top insulation layer, a first metal layer configured on a lower surface of the top insulation layer, and a top conductive layer configured on an upper surface of the top insulation layer;

wherein the first metal layer is connected with an AC power terminal.

Preferably, the bottom power substrate includes a bottom insulation layer, a second metal layer configured on an upper surface of the bottom insulation layer, and a bottom conductive layer configured on a lower surface of the bottom insulation layer;

wherein the second metal layer is connected with a DC power terminal.

Preferably, the interleaved switch units include: a first power semiconductor chip, a second power semiconductor chip, and a plurality of power spacers configured between the top power substrate and the bottom power substrate;

wherein the first power semiconductor chip is configured between the AC power terminal and the first metal layer, the second power semiconductor chip is configured between the DC power terminal and the second metal layer, and the first power semiconductor chip and the second power semiconductor chip are interleaved in a vertical direction.

Preferably, the first power semiconductor chip and the second power semiconductor chip that are adjacent to each other are connected in parallel to form upper and lower switches of a half-bridge structure.

Preferably, the first power semiconductor chip and the second power semiconductor chip are silicon-based power semiconductor chips.

Preferably, the power spacers are made of copper.

Preferably, the top insulation layer and the bottom insulation layer are made of silicon nitride.

Preferably, the top conductive layer and the bottom conductive layer are made of aluminum.

Based on the planar power module with a spatially interleaved structure according to the present invention, adjacent first power semiconductor chips and second power semiconductor chips form a spatially interleaved structure; that is, any two adjacent chips are not on the same horizontal plane. Such an interleaved arrangement manner can greatly reduce the degree of thermal coupling among all chips, making the level of thermal coupling among the chips relatively average. Thus, the module can get even thermal distribution. With such an interleaved arrangement manner, in a current loop of each chip, the current directions of adjacent parallel branches are opposite. In this way, an effect of greatly mutual parasitic inductance may be produced between adjacent chips, thereby greatly reducing the parasitic inductance of a commutation loop and balancing commutation parasitic inductance of each parallel branch. This makes the power module have a smaller voltage overshoot, dynamic and static balanced current sharing during switching transience.

DETAILED DESCRIPTION OF PREFERRED EMBODIMENTS

In order to make the objectives, technical solutions and advantages in implementations of the present invention clearer, the technical solutions in the implementations of the present invention will be described in detail below with reference to the accompanying drawings in the implementations of the present invention. It is obvious that the implementations to be described are only a part rather than all of the implementations of the present invention. All other implementations derived by those of ordinary skill in the art based on the implementations of the present invention without creative efforts should fall within the protection scope of the present invention. Therefore, the following detailed description of the implementations of the present invention provided in the accompanying drawings is not intended to limit the scope for which protection is sought by the present invention, but merely to represent the selected implementations of the present invention. All other implementations derived by those of ordinary skill in the art based on the implementations of the present invention without creative efforts should fall within the protection scope of the present invention.

Specific embodiments of the present invention are described in detail below with reference to the accompanying drawings.

The present invention discloses a planar power module with a spatially interleaved structure, which is intended to overcome the deficiency of the prior art.

Figure 1:
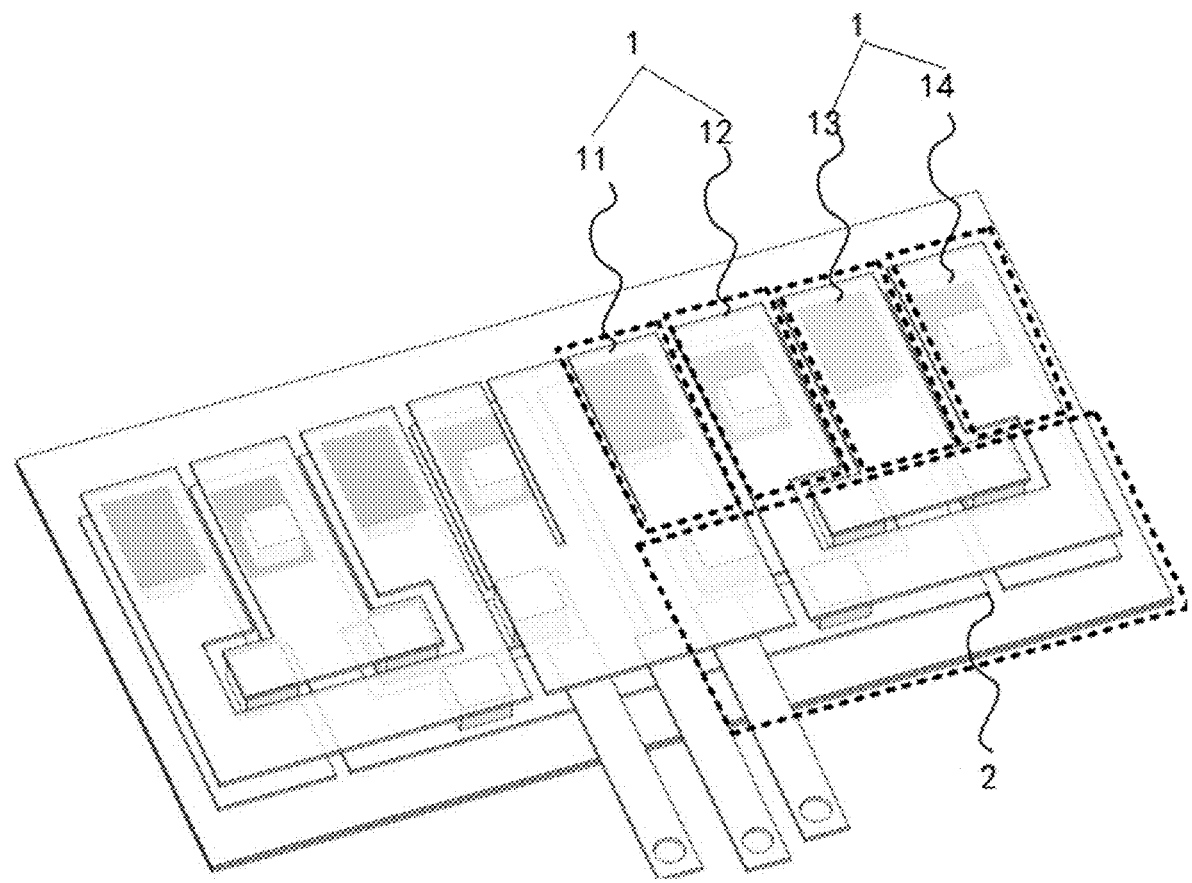
FIG. 1 is a schematic diagram of an overall structure of a planar power module with a spatially interleaved structure according to an embodiment of the present invention.
Figure 2:
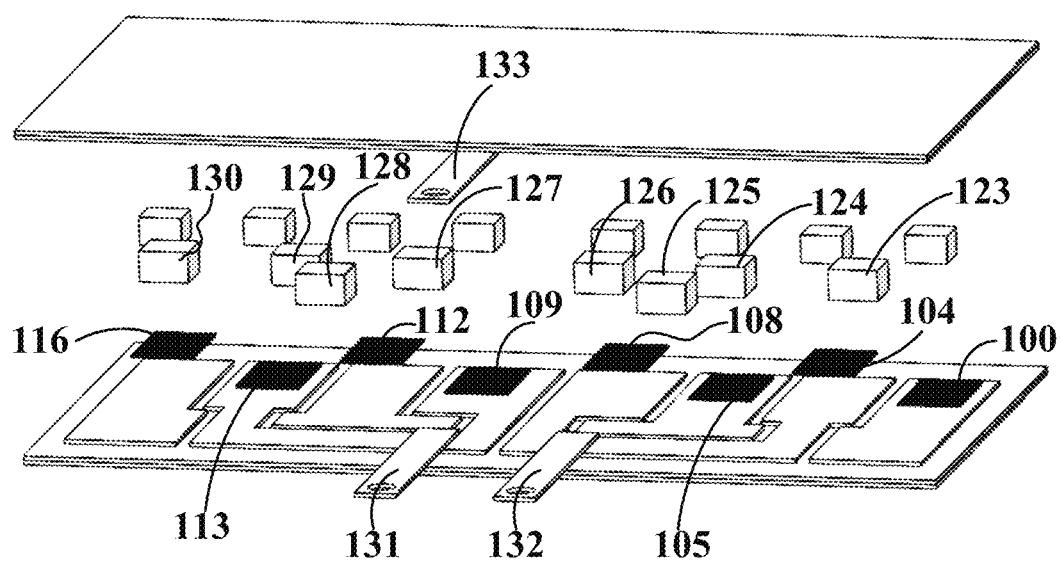
FIG. 2 is a schematic diagram of components of a planar power module with a spatially interleaved structure according to an embodiment of the present invention.
Figure 3:
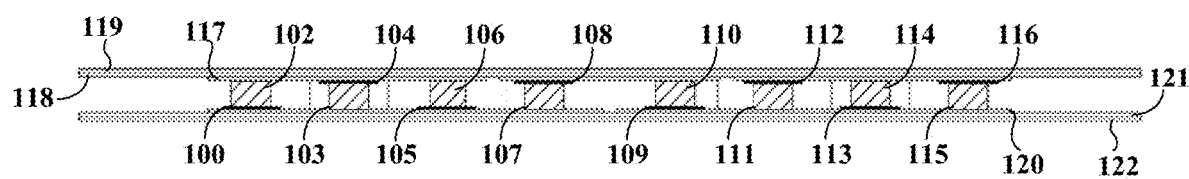
FIG. 3 is a front view of a planar power module with a spatially interleaved structure according to an embodiment of the present invention.

Referring to FIGS. 1 to 3, an embodiment of the present invention provides a planar power module with a spatially interleaved structure, including a top power substrate, a bottom power substrate arranged opposite to the top power substrate, and a plurality of interleaved switch units 1 (composed of 11 and 12 or 13 and 14) configured between the top power substrate and the bottom power substrate.

Adjacent interleaved switch units 1 are electrically connected through a current commutator 2, so that the interleaved switch units 1 form spatial position interleaving.

In this embodiment, the top power substrate includes a top insulation layer 118, a first metal layer 117 configured on a lower surface of the top insulation layer 118, and a top conductive layer 119 configured on an upper surface of the top insulation layer 118.

The first metal layer 117 is connected with an AC power terminal 133.

In this embodiment, the bottom power substrate includes a bottom insulation layer 121, a second metal layer 120 configured on an upper surface of the bottom insulation layer 121, and a bottom conductive layer 122 configured on a lower surface of the bottom insulation layer 121.

The second metal layer 120 is connected with a DC power terminal. The DC power terminal includes a positive terminal 131 and a negative terminal 132.

In this embodiment, the interleaved switch units include: a first power semiconductor chip 116, a second power semiconductor chip 113, and a plurality of power spacer configured between the top power substrate and the bottom power substrate (it is to be understood that the chips herein configured on the top are defined as first power semiconductor chips, such as icons 116, 112, 108, 104, and similarly, the chips configured at the bottom are defined as second power semiconductor chips 113, 109, 105, 100). Icons of the power spacer are (102, 103, 106, 107, 110, 111, 114, 115, 123, 124, 125, 126, 127, 128, 129, 130). It is to be understood that the power spacers are configured for electrical connections, heat transfer, and mechanical support.

The first power semiconductor chip 116 is configured between the AC power terminal 133 and the first metal layer 117, the second power semiconductor chip 113 is configured between the DC power terminal and the second metal layer 120, and the first power semiconductor chip and the second power semiconductor chip 113 are interleaved in a vertical direction.

In this embodiment, the first power semiconductor chip 116 and the second power semiconductor chip 113 that are adjacent to each other are connected in parallel to form upper and lower switches of a half-bridge structure.

It shall be noted that two groups of parallel power semiconductor chips (four in each group and a total of 8) constitute upper and lower switches of a classical half-bridge structure in this embodiment. In actual power module design, the chip's number via parallel or series connection domains the current capability and breakdown voltage level. In addition, anti-parallel diode chips can be considered as required. It is noteworthy that the power semiconductor chips mentioned in this embodiment include, but are not limited to, wide-band-gap power semiconductor chips.

In this embodiment, the interleaved switch units are connected through a current commutator, so that the first power semiconductor chip and the second power semiconductor chip form spatial position interleaving. Adjacent semiconductor chips are distributed on the top power substrate and the bottom power substrate, thereby achieving two thermal performance advantages under a compact layout condition:

Firstly, a degree of thermal coupling among a plurality of chips is greatly reduced. It may be understood that under the same working conditions and with the same semiconductor chip, compared with the traditional power module, coupling thermal resistance between the chips is reduced a lot, so the temperature of the chips may also be reduced greatly. It is to be understood that the chips can bear greater current levels and power levels.

Secondly, thermal coupling between each chip and the remaining chips is consistent, and even chip temperatures in the working state can greatly improve the overall reliability of the power module. It is to be understood that the even chip temperatures can ensure consistent threshold voltages, thereby ensuring dynamic current equalization between the parallel chips. Besides, the even chip temperatures can ensure the reliability of the soldering layers between the chips and the power substrates, avoiding thermal runaway due to a certain soldering layer failure. The spatial interleaving arrangement of the plurality of chips further directly determines the balanced current sharing.

Based on this embodiment, electrical properties can be improved in two aspects: the first is mutual inductance cancellation in the inner of interleaved switch unit.

The second is mutual inductance cancellation between adjacent interleaved switches. Such two effects jointly reduce the parasitic inductance in the commutation loop and implement balanced current sharing between parallel branches.

This embodiment implements a half-bridge structure. Such a structure (which may be composed of one or more structures in series-parallel connections) may constitute, but is not limited to, DC-AC, DC-DC, AC-AC, and AC-DC converter circuits such as a three-phase inverter full-bridge circuit, a synchronous rectifier, and a single-phase inverter full-bridge. The packaging structure proposed in this embodiment has a very low parasitic inductance of the commutation loop and has static and dynamic balanced current sharing functions of parallel branches for high-current applications, so the balanced current sharing and lower voltage overshoot can be obtained. In this embodiment, the thermal coupling of all chips is greatly reduced, and degrees of thermal coupling among all the chips are rather equal, so high heat transfer efficiency and even chip junction temperatures distribution can be obtained. In this embodiment, the heat generated by all chips has two transfer paths, thus greatly reducing the thermal resistance from the chips to the environment. Based on the above, the packaging structure proposed in the present invention can operate reliably at a very high current level, a very high switching frequency, and a high junction temperature. Thereby, it can make full use of the superior performance of semiconductor chips, especially of third-generation semiconductor chips.

In this embodiment, the first power semiconductor chip and the second power semiconductor chip may be silicon-based power semiconductor chips.

It shall be noted that in other embodiments, the first power semiconductor chip and the second power semiconductor chip may also be SiC-based or GaN-based power semiconductor chips, which are not specifically limited herein, but these solutions are all within the protection scope of the present invention.

In this embodiment, the power spacer may be made of copper.

It shall be noted that in other embodiments, the power spacer assembly may also be made of elementary substance aluminum, copper-molybdenum-copper composite plate material, tungsten-copper alloy material, or zinc-copper alloy material, which are not specifically limited herein, but these solutions are all within the protection scope of the present invention.

In this embodiment, the top insulation layer and the bottom insulation layer may be made of silicon nitride.

It shall be noted that in other embodiments, the top insulation layer 118 and the bottom insulation layer 121 may also be made of aluminum oxide or aluminum nitride, which are not specifically limited herein, but these solutions are all within the protection scope of the present invention.

In this embodiment, the top conductive layer 119 and the bottom conductive layer 122 may be made of aluminum.

It shall be noted that in other embodiments, the top conductive layer and the bottom conductive layer may also be made of copper, which are not specifically limited herein, but these solutions are all within the protection scope of the present invention.

Based on the planar power module with a spatially interleaved structure according to the present invention, adjacent first power semiconductor chips and second power semiconductor chips form a spatially interleaved structure; that is, any two adjacent chips are not on the same horizontal plane. Such an interleaved arrangement manner can greatly reduce a degree of thermal coupling among all chips, making the degree of thermal coupling among the chips relatively average, to reach even temperature distribution. With such an interleaved arrangement manner, in the adjacent parallel chips' current loop, current directions are opposite. In this way, an effect of greatly mutual parasitic inductance may be produced between adjacent chips, thereby greatly reducing parasitic inductance, and balancing parasitic inductance of each parallel commutation branch. This makes the power module have smaller voltage overshoot and dynamic and static balanced current sharing during switching transience.

The above are merely preferred implementations of the present invention. The protection scope of the present invention is not limited to the above embodiments, and all technical solutions under the idea of the present invention fall within the protection scope of the present invention.

What is claimed is:

1. A planar power module with a spatially interleaved structure, comprising a top power substrate, a bottom power substrate arranged opposite to the top power substrate, and a plurality of interleaved switch units configured between the top power substrate and the bottom power substrate; the plurality of interleaved switch units comprises a plurality of first bower semiconductor chips, a plurality of second bower semiconductor chips, and a plurality of power spacers;

wherein each of the plurality of interleaved switch units comprises one of the plurality of first power semiconductor chips, one of the plurality of second power semiconductor chips, and two of the plurality of power spacers, which are configured between the top power substrate and the bottom power substrate;

in each of the plurality of interleaved switch units, the first power semiconductor chip is arranged on a top of one of the two power spacers, and the second power semiconductor chip is arranged on a bottom of the other one of the two power spacers; and in the plurality of interleaved switch units, the plurality of first power semiconductor chips and the plurality of second power semiconductor chips are arranged at intervals.

2. The planar power module with a spatially interleaved structure according to claim 1, wherein the top power substrate comprises a top insulation layer, a first metal layer configured on a lower surface of the top insulation layer, and a top conductive substrate configured on an upper surface of the top insulation layer; wherein the first metal layer is connected with an AC power terminal.

3. The planar power module with a spatially interleaved structure according to claim 2, wherein the bottom power substrate comprises a bottom insulation layer, a second metal layer configured on an upper surface of the bottom insulation layer, and a bottom conductive substrate configured on a lower surface of the bottom insulation layer; wherein the second metal layer is connected with a DC power terminal.

4. The planar power module with a spatially interleaved structure according to claim 3, wherein the top insulation layer and the bottom insulation layer are made of silicon nitride.

5. The planar power module with a spatially interleaved structure according to claim 3, wherein the top conductive layer and the bottom conductive layer are made of aluminum.

6. The planar power module with a spatially interleaved structure according to claim 1, wherein the first power semiconductor chip and the second power semiconductor chip that are adjacent to each other are connected in parallel to form upper and lower switches of a half-bridge structure.

7. The planar power module with a spatially interleaved structure according to claim 1, wherein the first power semiconductor chip and the second power semiconductor chip are silicon-based power semiconductor chips.

8. The planar power module with a spatially interleaved structure according to claim 1, wherein the power spacers are made of copper.

\* \* \* \* \*